United States Patent [19]

Majima et al.

[11] Patent Number: 4,464,459

[45] Date of Patent: Aug. 7, 1984

[54] METHOD OF FORMING A PATTERN OF METAL ELEMENTS

[75] Inventors: Teiji Majima, Komae; Kiyoshi Ozaki, Suzaka, both of Japan

[73] Assignee: Fujitsu Limited, Kawasaki, Japan

[21] Appl. No.: 392,173

[22] Filed: Jun. 25, 1982

[30] Foreign Application Priority Data

Jun. 26, 1981 [JP] Japan .................................. 56-98371

[51] Int. Cl.³ .............................................. H01L 21/18
[52] U.S. Cl. ..................................... 430/313; 156/643; 204/192 EC; 204/192 E; 204/192 D; 427/89; 427/90; 427/131; 427/132; 430/314; 430/315; 430/318; 430/319
[58] Field of Search ................... 427/89, 90, 131, 132; 204/192 EC, 192 E, 192 D; 430/313–315, 319, 318; 156/643

[56] References Cited

U.S. PATENT DOCUMENTS

| 4,251,319 | 2/1981 | Bonnie | 427/96 |
| 4,321,284 | 3/1982 | Yakushiji | 427/90 |
| 4,356,210 | 10/1982 | Imai | 204/192 EC |
| 4,376,137 | 3/1983 | Gergis | 427/132 |

Primary Examiner—John D. Smith
Attorney, Agent, or Firm—Staas & Halsey

[57] ABSTRACT

A method of forming a pattern of metal elements arranged with very small gaps therebetween on a substrate in magnetic bubble memory devices, semiconductor devices, and the like. In this method, first, a pattern forming layer having metal portions adapted for forming pattern elements and insulating portions for providing the gaps is formed on the substrate, and thereafter the pattern forming layer is processed by using a photolithograhic technique to form the pattern. By using this method, it is possible to form a permalloy propagation pattern with gaps of a size smaller than 1 μm in a magnetic bubble memory device, for example, by using conventional photolithograhic techniques.

8 Claims, 38 Drawing Figures

Fig. IA
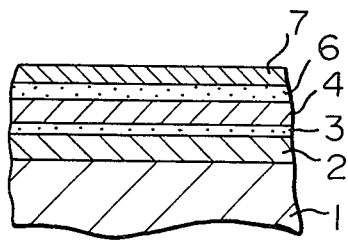
Fig. IB
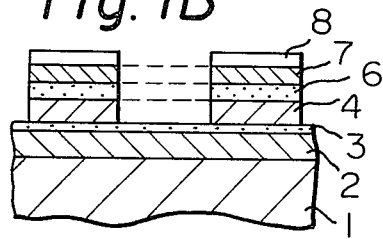
Fig. IC
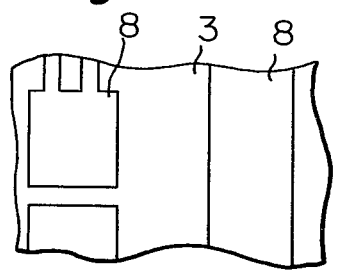
Fig. ID
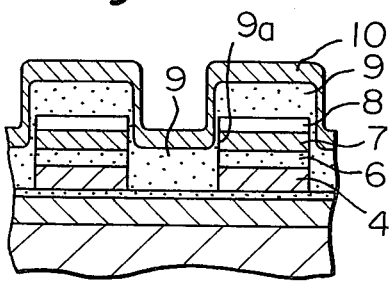
Fig. IE
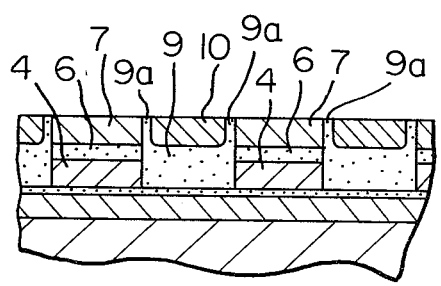
Fig. IF
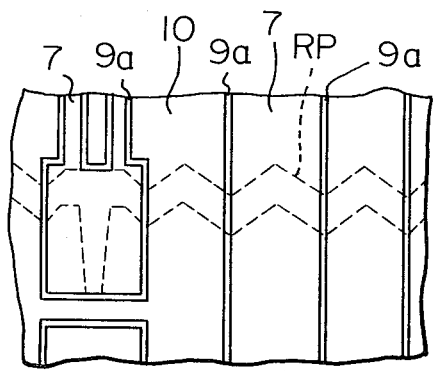
Fig. IG
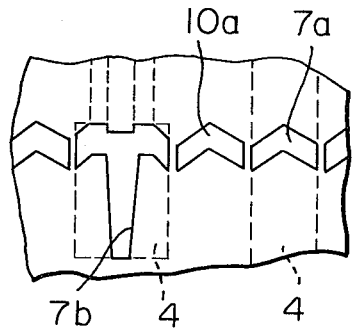

METHOD OF FORMING A PATTERN OF METAL ELEMENTS

BACKGROUND OF THE INVENTION

The present invention relates to a microfabrication technique which may be advantageously used, for example, for the manufacture of magnetic bubble memory devices, semiconductor devices, and the like. More particularly, the present invention relates to a method for forming a pattern of metal elements arranged with very small gaps therebetween on a substrate of a device.

In well-known field access types of magnetic bubble memory devices, a permalloy pattern for the propagation of magnetic bubbles (permalloy propagation pattern) is formed on the bubble-supporting magnetic layer of a substrate. The permalloy propagation pattern is constituted by a plurality of pattern elements made of thin films of permalloy. These permalloy pattern elements are chevron-shaped or half disc-shaped, for example, and are arranged with very small gaps therebetween. In a magnetic bubble memory device using 2 $\mu$m diameter bubbles, the size of the gap is approximately 1 $\mu$m.

The pattern of metal elements such as the permalloy propagation pattern described above is conventionally formed by using photolithographic techniques. That is, first, a pattern forming layer of metal is formed on a substrate of a device. Next, the pattern forming layer is coated with a layer of photosensitive resist material (photoresist). An optical exposure process is used to form a resist pattern corresponding to the pattern of metal elements to be formed from the layer of photoresist. Thereafter, an etching process is used to form the pattern of metal elements from the pattern forming layer.

However, the smallest size of the resist pattern which can be formed on the pattern forming layer by using the photolithographic technique is approximately 1 $\mu$m. Therefore, according to the conventional method, it is impossible to form a pattern of metal elements with gaps of a size smaller than 1 $\mu$m.

In recent years, there have been a number of proposals for realization of a high density magnetic bubble memory device using 1 $\mu$m diameter bubbles. Such a device requires a permalloy propagation pattern with gaps of a size less than 0.5 $\mu$m. In order to satisfy this requirement, the electron-beam lithographic technique or X-ray lithographic technique is used. However, electron-beam systems and X-ray systems are large in size and high priced, thereby increasing the overall cost of the equipment.

SUMMARY OF THE INVENTION

It is, therefore, a principal object of the present invention to provide a method which makes it possible to form a pattern of metal elements with gaps of a size smaller than 1 $\mu$m by using conventional photolithographic techniques.

According to the present invention, there is provided a method of forming a pattern of metal elements arranged with very small gaps therebetween on a substrate, comprising the steps of: forming a pattern forming layer on the substrate, the pattern forming layer having portions of metal from which the pattern elements are formed and portions of insulating materials which are interposed between the metal portions so as to provide the gaps; and processing the pattern forming layer by using photolithographic techniques to form the pattern therefrom.

The present invention will now be described in detail based on preferred embodiments with reference to the accompanying drawings.

BRIEF DESCRIPTION OF THE DRAWINGS

FIGS. 1A through 1G illustrate a process of manufacturing a magnetic bubble memory device by a first embodiment of the present invention;

DESCRIPTION OF THE PREFERRED EMBODIMENTS

Figure 2:
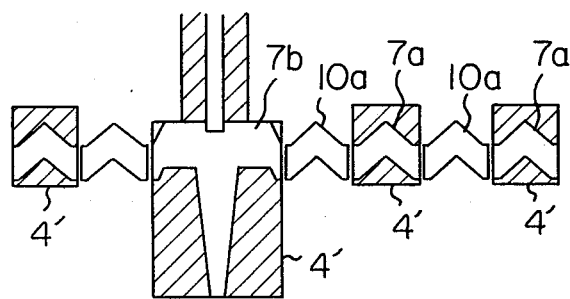
FIG. 2 is a schematic plan view of a magnetic bubble memory device manufactured by a second embodiment of the present invention.

The embodiments described herein are adapted for manufacturing a magnetic bubble memory device using 2 $\mu$m diameter bubbles and having a permalloy propagation pattern with gaps each having a size smaller than 1 $\mu$m.

FIGS. 1A through 1G illustrate the first embodiment of the present invention, by which is formed a permalloy propagation pattern constituted by pattern elements 7a, 7b, and 10a, as illustrated in FIG. 1G. It should be noted that FIGS. 1A, 1B, 1D, and 1E are sectional views of the magnetic bubble memory device and FIGS. 1C, 1F, and 1G are plan views.

Referring to FIG. 1A, reference numeral 1 designates a substrate of gadolinium gallium garnet (GGG) of a thickness less than 500 $\mu$m. On the GGG substrate, a 2 $\mu$m layer 2 of magnetic garnet is deposited by liquid-phase epitaxial growth. Over the magnetic garnet layer 2, 0.1 $\mu$m SiO$_2$ insulating layer 3, 0.4 $\mu$m Al-Cl conductor layer 4, 0.2 $\mu$m SiO$_2$ insulating layer 6, and 0.35 $\mu$m permalloy layer 7 are successively deposited by vapor deposition or sputtering.

Next, as illustrated in FIGS. 1B and 1C, permalloy layer 7 is coated with a layer of photoresist (e.g., AZ 1350). An optical exposure process is used to form resist pattern 8. Thereafter, an etching process, advantageously, an ion etching process, is used to pattern conductor layer 4, insulating layer 6, and permalloy layer 7, thereby forming conductor pattern 4 and permalloy portions 7 from which pattern elements 7a and 7b are formed, as will be described hereinafter. It should be noted that since resist pattern 8 is also ion etched, the initial thickness of resist pattern 8 is determined so that it is 1 $\mu$m after being etched.

After the etching process, as illustrated in FIG. 1D, SiO₂ is sputtered or SiO is vapor deposited to form 0.6 μm insulating layer 9. In this process, insulating materials SiO₂ or SiO are deposited on the side surfaces of permalloy portions 7, thereby forming walls 9a. The thickness of walls 9a is one-half or less that of insulating layer 9, in the case of this embodiment, 0.3 μm or less. As will be described hereinafter, walls 9a act as spacers which provide for the gaps between pattern elements 7a, 7b, and 10a. Furthermore, 0.35 μm permalloy layer 10 is formed on insulating layer 9 by vapor deposition, for example.

Thereafter, a lift-off process is used to remove resist pattern 8 together with insulating materials 9 and permalloy 10 thereon. The lift-off process can be performed by scrubbing the surface of permalloy layer 10 with the aid of resolvents, such as acetone, or a 1-1 acetone-isopropyl alcohol mixture, for the case of the resist AZ 1350. Consequently, as illustrated in FIGS. 1E and 1F, a pattern forming layer is formed which has permalloy portions 7 and 10 arranged with spacer portions 9a interposed therebetween.

Next, the pattern forming layer is processed by using the photolithographic technique to form the permalloy propagation pattern. First, as illustrated in FIG. 1F, the pattern forming layer is coated with a layer of photoresist (not illustrated). An optical exposure process is used to form a resist pattern RP (shown in dotted lines). The optical exposure process uses an exposing mask, which has a contiguous mask pattern without gaps and having such a configuration that pattern elements 7a, 7b, and 10a are interconnected. Accordingly, resist pattern RP is also a contiguous pattern without gaps. Thereafter, the pattern forming layer is etched to form pattern elements 7a, 7b, and 10a from permalloy portions 7 and 10. These pattern elements are separated from each other with spacer portions 9a and, accordingly, the permalloy propagation pattern with gaps of a size smaller than 0.3 μm is formed.

The second embodiment of the present invention will now be described with reference to FIG. 2. The second embodiment is substantially the same as the first embodiment described hereinbefore, except for the configuration of the conductor pattern. In the first embodiment, conductors 4 (shown in dotted lines) are stripe-shaped, as illustrated in FIG. 1G. In the second embodiment, conductors 4' are square land-shaped. Conductors 4' can be formed by forming resist pattern 8 into a configuration corresponding to that of conductors 4' in the process illustrated in FIGS. 1B and 1C. The square land-shaped conductor 4' makes it possible to reduce the influence of the eddy current produced by the magnetic flux caused by the permalloy pattern. This fact makes it possible to eliminate the problems caused by the eddy current in a high frequency of operation of the magnetic bubble memory device, problems which increase in severity as the frequency of operation becomes higher. That is, it is possible to realize a magnetic bubble memory device which can be sufficiently adapted for several hundred kHz of operation.

Figure 3A:
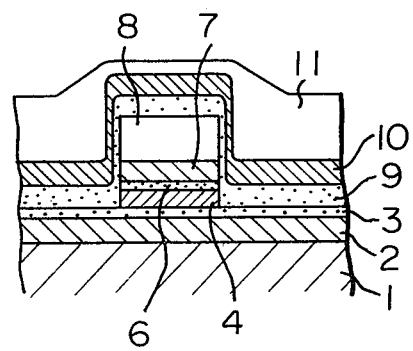
FIGS. 3A through 3C illustrate a process of manufacturing a magnetic bubble memory device by a third embodiment of the present invention.
Figure 3B:
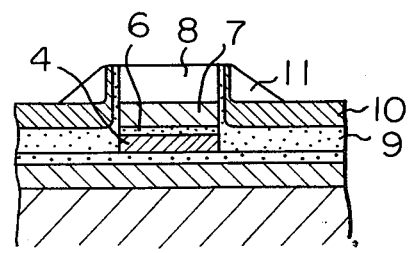
Figure 3C:
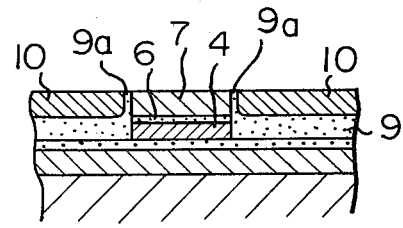

The third embodiment of the present invention will now be described with reference to FIGS. 3A through 3C. The third embodiment is also substantially the same as the first embodiment described hereinbefore, except for a process performed between the stage illustrated in FIG. 1E and the stage illustrated in FIG. 1F, that is, a process of lift-off of resist pattern 8. As described hereinbefore, in the first embodiment, the lift-off process is performed merely by scrubbing resist pattern 8 with the aid of a resolvent. However, the lift-off may not be easy, because resist pattern 8 is covered with insulating layer 9 and permalloy layer 10. In the third embodiment, this problem can be resolved in the following manner. Namely, after permalloy layer 10 has been formed as illustrated in FIG. 1D, resin layer 11 of, for example, AZ type, polyimide type, or polyladder-siloxane type resist material is formed on permalloy layer 10, as illustrated in FIG. 3A. Resin layer 11 is 1.5 μm thick at the portion formed on the flat surface of permalloy layer 10 and 0.25 μm thick at the portion formed on permalloy layer 10 deposited on resist pattern 8. Next, the entire surface of the device is ion etched. Since the ion etching process is poor in selective etch characteristics, the surface to be etched is lowered with the original shape being substantially maintained. The ion etching process is performed until the surface of resist pattern 8 has been exposed. Finally, a scrubbing process is used with the aid of a resolvent to remove resist pattern 8 and resin layer 11. In this process, the rising portions of insulating layer 9 and permalloy layer 10 are also removed, and, accordingly, a flat pattern forming layer as illustrated in FIG. 3C is formed. It should be noted that the stage illustrated in FIG. 3C corresponds to that illustrated in FIG. 1E.

The fourth embodiment of the present invention will now be described with reference to FIGS. 4A through 4H. In this embodiment, a permalloy propagation pattern of pattern elements 14a and 16a is formed as illustrated in FIG. 4H. It should be noted that FIGS. 4A, 4G and 4H are plan views of a magnetic bubble memory device and FIGS. 4B through 4F are sectional views.

Figure 4A:
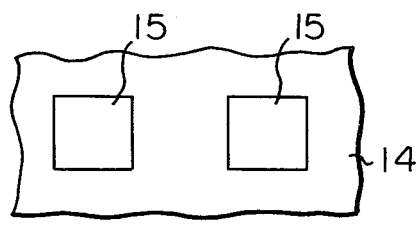
FIGS. 4A through 4H illustrate a process of manufacturing a magnetic bubble memory device by a fourth embodiment of the present invention.
Figure 4E:
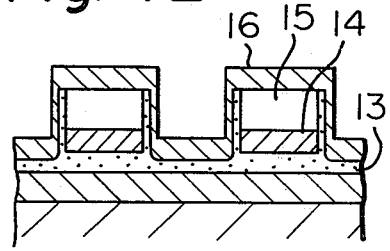
Figure 4B:
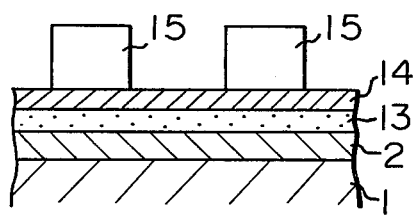
Figure 4F:
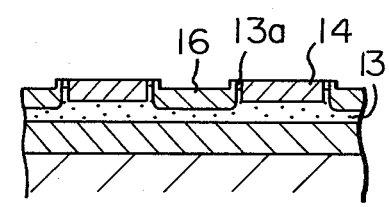
Figure 4C:
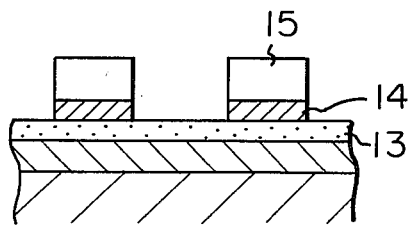
Figure 4G:
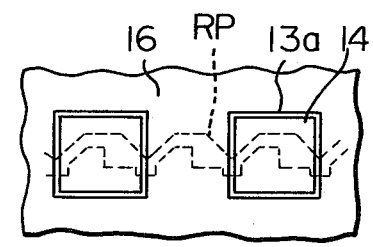

Referring to FIGS. 4A and 4B, over magnetic garnet layer 2 deposited on GGG substrate 1, 0.4 μm SiO₂ insulating layer 13 and 0.35 μm permalloy layer 14 are successively formed by vapor deposition or sputtering. Next, resist pattern 15 is formed on permalloy layer 14. An ion etching process is used to pattern permalloy layer 14 so as to form permalloy portions 14, from which pattern elements 14a are formed, as will be described hereinafter.

Figure 4D:
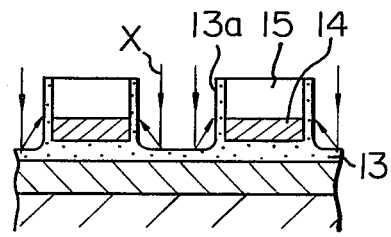
Figure 4H:
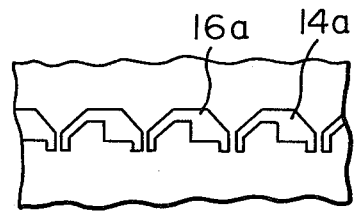

Next, as illustrated in FIG. 4D, an ion etching process is used to etch the surface of insulating layer 13. In this process, spatters of insulating material SiO₂, which are struck out from insulating layer 13 by ions (shown in arrows X), are deposited on the side surfaces of permalloy portions 14, thereby forming walls 13a. Walls 13a are 0.1 μm thick, for example, and act as spacers which provide gaps between pattern elements 14a and 16a, as described hereinafter.

Next, as illustrated in FIG. 4E, permalloy layer 16 is formed by vapor deposition or sputtering. Resist pattern 15 is then lifted off. Consequently, as illustrated in FIGS. 4F and 4G, a pattern forming layer is formed which has permalloy portions 14 and 16 with spacer portions 13a therebetween. In the illustrated embodiment, there is a step between the surfaces of permalloy portions 14 and 16. This step, if undesirable, can be eliminated by depositing insulating materials, such as SiO or Cr₂O₃, on the etched surface of insulating layer 13 by vapor deposition, prior to the process of forming permalloy layer 16 illustrated in FIG. 4E.

Thereafter, the same process as that used in the first embodiment is used to form contiguous resist pattern RP without gaps (shown in dotted lines) on the pattern forming layer. Next, an etching process is used to form a permalloy propagation pattern of pattern elements 14a and 16a from the pattern forming layer. Pattern elements 14a and 16a are arranged with 0.1 μm gaps therebetween, which are provided for by spacer portions 13a.

Figure 5A:
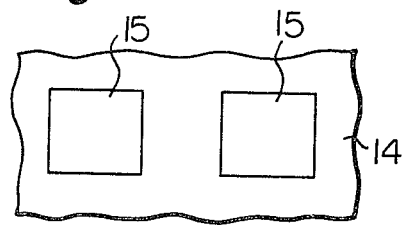
FIGS. 5A through 5I illustrate a process of manufacturing a magnetic bubble memory device by a fifth embodiment of the present invention.
Figure 5B:
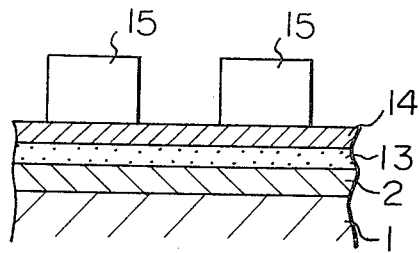
Figure 5C:
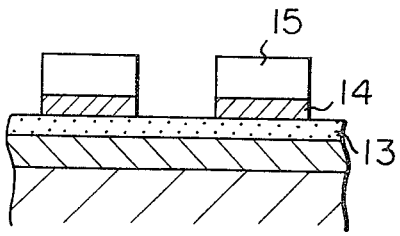
Figure 5D:
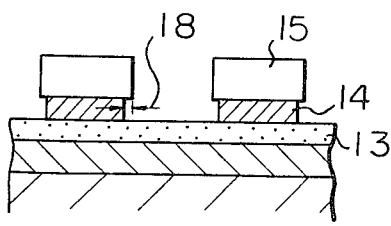
Figure 5E:
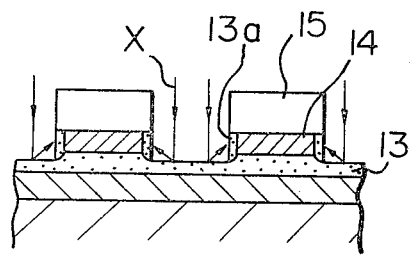
Figure 5F:
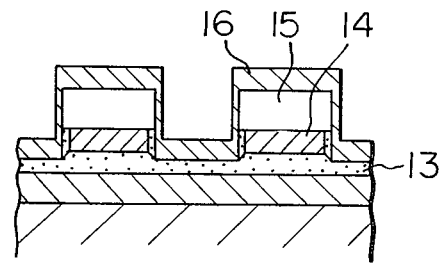
Figure 5G:
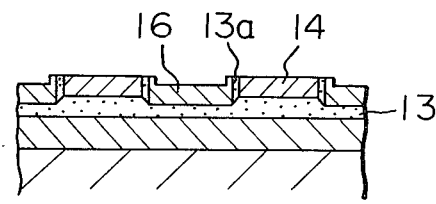
Figure 5H:
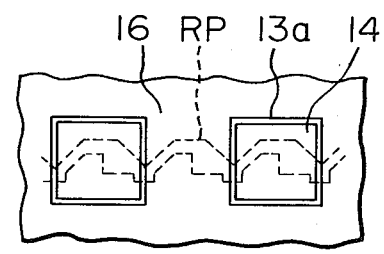
Figure 5I:
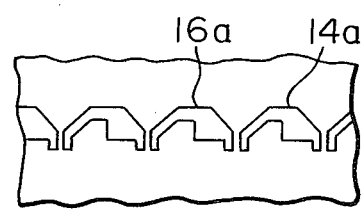
Figure 7:
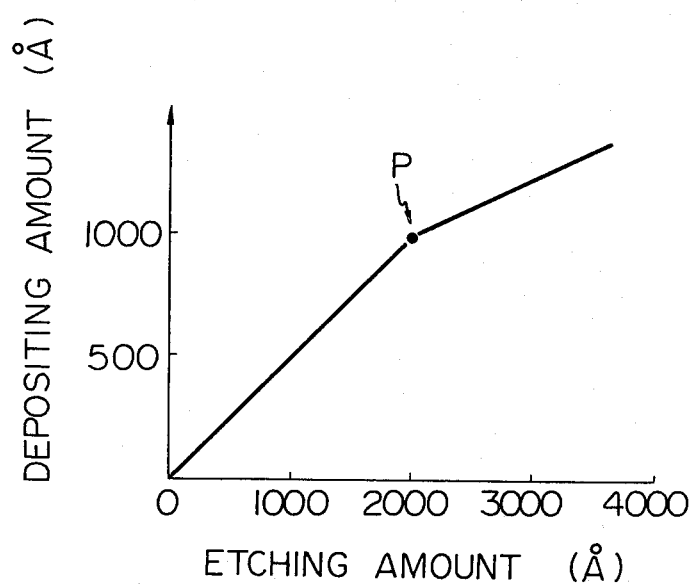
FIG. 7 is a diagram illustrating the relationship between the etching amount and the depositing amount of insulating materials on the undercut portion when an insulating layer is ion etched in the fifth and sixth embodiments.

FIGS. 5A through 5I illustrate the fifth embodiment of the present invention, which is similar to the fourth embodiment described hereinbefore. However, after the process of patterning permalloy layer 14 as illustrated in FIG. 5C, a chemical etching process is used to provide permalloy portions 14 with 0.1 μm undercuts 18 as illustrated in FIG. 5D. This etching process employs an etchant composed of $HNO_3$ (500 cc), $H_2O$ (500 cc), and FeCl (2.5 g) and is performed for 5 seconds at 25° C. Next, as illustrated in FIG. 5E, insulating layer 13 is ion etched, so that insulating materials $SiO_2$ are sputtered on the undercut surfaces of permalloy portions 14 to form walls 13a. In this process, since undercuts 18 are not subjected to ion etching, walls 13a can be formed by an etching amount less than that in the fourth embodiment. FIG. 7 illustrates the relationship between the etching amount and the depositing amount of $SiO_2$ on the undercut portion when insulating layer 13 is ion etched, wherein the abscissa indicates the etching amount and the ordinate indicates the depositing amount. The embodiment illustrated is that in the case of a 1000 Å undercut. It will be understood that the depositing amount efficiently increases until it reaches the size of the undercut (shown by the point "P").

Thereafter, as illustrated in FIGS. 5F through 5I, the process as described with reference to FIGS. 4E through 4H is used to form the permalloy propagation pattern.

Figure 6A:
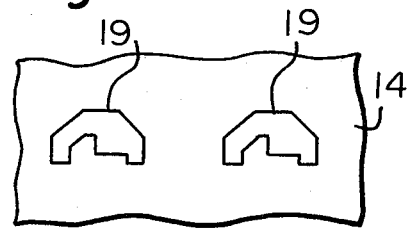
FIGS. 6A through 6I illustrate a process of manufacturing a magnetic bubble memory device by a sixth embodiment of the present invention.
Figure 6B:
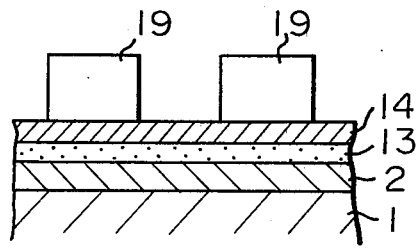
Figure 6C:
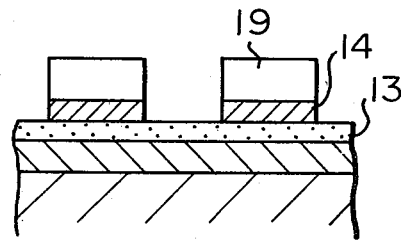
Figure 6D:
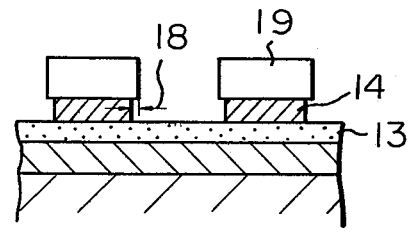
Figure 6E:
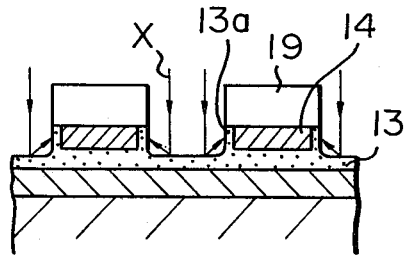
Figure 6F:
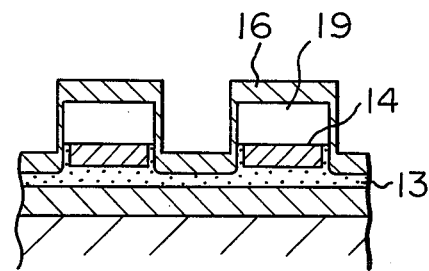
Figure 6G:
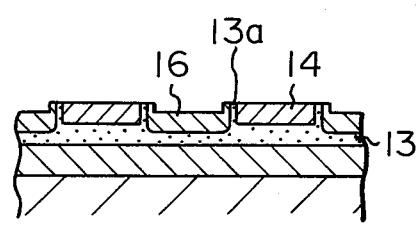
Figure 6H:
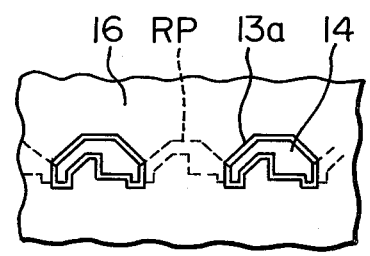
Figure 6I:
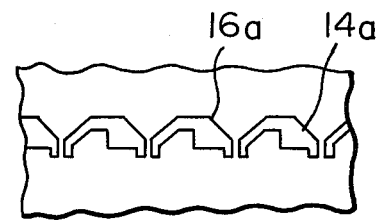

FIGS. 6A through 6I illustrate the sixth embodiment of the present invention, which is substantially the same as the fifth embodiment described hereinbefore. However, as illustrated in FIG. 6A, resist pattern 19 formed on permalloy layer 14 has a configuration which substantially corresponds to the half disk-shaped configuration of pattern elements 14a. Accordingly, as illustrated in FIGS. 6G and 6H, permalloy portions 14 in the pattern forming layer are in the form of pattern elements 14a, and resist pattern RP is formed on the pattern forming layer so as to be registered with permalloy portions 14.

As described above, the present invention provides a method which makes it possible to form a pattern of metal elements with very small gaps of size less than 1 μm therebetween by using conventional photolithographic techniques and, accordingly, contributes to the efficient manufacture of magnetic bubble memory devices, semiconductor devices, and the like.

We claim:

1. A method of forming a pattern of metal elements on a substrate of a magnetic bubble memory or semiconductor device, comprising the steps of:
    forming a pattern forming layer on said substrate, said pattern forming layer having (i) portions of metal positioned in a plane substantially parallel to the plane of the substrate and spaced apart by a gap of less than 1 μm from which said pattern of metal elements is formed and (ii) portions of insulating materials interposed between said metal portions in said gaps; and
    processing said pattern forming layer by using photolithographic techniques to form said pattern therefrom.

2. A method according to claim 1, wherein the step of forming said pattern forming layer comprises the steps of:
    forming a plurality of first metal portions spaced apart from each other on the substrate;
    forming said insulating portions on the side surfaces of said first metal portions;
    forming a plurality of second metal portions, each second metal portion being located between two of said first metal portions with said insulating portions interposed between each first and second metal portion on the substrate; and
    thereafter, performing lift-off of material deposited and formed beyond the surface of said first metal portion.

3. A method according to claim 2, wherein said first metal portions are formed by:
    forming a layer of metal on the substrate; and
    processing said metal layer by using photolithographic techniques.

4. A method according to claim 2, wherein said insulating portions are formed by depositing insulating materials on the side surfaces of said first metal portions by vapor deposition or sputtering.

5. A method according to claim 2, wherein said insultaing portions are formed on the side surfaces of said first metal portions by:
    forming a layer of insulating materials on the substrate;
    forming said first metal portions with side surfaces on said insulating layer; and,
    thereafter, ion etching said insulating layer, with the upper surfaces of the first metal portions being coated with resist, so that the resultant sputters of insulating materials are deposited on the side surfaces of the first metal portions.

6. A method according to claim 5, wherein, prior to the step of ion etching, said first metal portions are undercut.

7. A method according to claim 1, wherein the photolithographic technique used in said step of processing the pattern forming layer employs an exposing mask, which has a contiguous mask pattern without gaps and has such a configuration that said pattern elements are interconnected.

8. A method according to claim 1, wherein said substrate is provided with a bubble-supporting magnetic layer and said pattern elements are formed of magnetic materials so as to provide a magnetic bubble propagation pattern.

* * * * *